United States Patent
Park et al.

(10) Patent No.: US 10,199,539 B2
(45) Date of Patent: Feb. 5, 2019

(54) VERTICAL ULTRAVIOLET LIGHT EMITTING DEVICE

(71) Applicant: SEOUL VIOSYS CO., LTD, Gyeonggi-do (KR)

(72) Inventors: Ki Yon Park, Ansan-si (KR); Yu Dae Han, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/881,633

(22) Filed: Jan. 26, 2018

(65) Prior Publication Data

US 2018/0151775 A1    May 31, 2018

Related U.S. Application Data

(63) Continuation of application No. 15/515,991, filed as application No. PCT/KR2015/010317 on Sep. 30, 2015, now Pat. No. 9,905,728.

(30) Foreign Application Priority Data

Sep. 30, 2014    (KR) .................. 10-2014-0131986

(51) Int. Cl.
*H01L 33/02*    (2010.01)
*H01L 33/04*    (2010.01)
(Continued)

(52) U.S. Cl.
CPC ............ *H01L 33/14* (2013.01); *H01L 33/025* (2013.01); *H01L 33/06* (2013.01); *H01L 33/325* (2013.01); *H01L 33/04* (2013.01); *H01L 33/32* (2013.01)

(58) Field of Classification Search
None
See application file for complete search history.

(56) References Cited

U.S. PATENT DOCUMENTS

| 2016/0064598 A1* | 3/2016 | Choi | ................ H01L 33/06 257/13 |
| 2016/0149075 A1* | 5/2016 | Atanackovic | ........... H01L 33/06 257/13 |

FOREIGN PATENT DOCUMENTS

| JP | 5125513 B2 | 1/2013 |
| KR | 1020060072446 A | 6/2006 |

(Continued)

OTHER PUBLICATIONS

International Search Report and Written Opinion for PCT/KR2015/010317, filed Sep. 30 2015, Applicant: Seoul Viosys Co., Ltd., dated Jan. 13, 2016, ISA/KR, 7 pages.

*Primary Examiner* — Whitney Moore
(74) *Attorney, Agent, or Firm* — Perkins Coie LLP

(57) ABSTRACT

A UV light emitting device is disclosed. The UV light emitting device includes: a substrate; an n-type semiconductor layer disposed on the substrate; an active layer disposed on then-type semiconductor layer; a hole injection layer disposed on the active layer and comprising Al; an Al-delta layer disposed on the hole injection layer and comprising Al; and a first p-type contact layer disposed on the Al-delta layer and having a higher doping concentration of p-type dopants than the hole injection layer, wherein the first p-type contact layer has a lower Al content than the hole injection layer, a band-gap of the first p-type contact layer is lower than or equal to energy of light emitted from the active layer, and the Al-delta layer has a higher Al content than the hole injection layer and allows holes to enter the active layer by tunneling therethrough.

43 Claims, 2 Drawing Sheets

(51) Int. Cl.
*H01L 33/06* (2010.01)
*H01L 33/14* (2010.01)
*H01L 33/32* (2010.01)

(56) References Cited

FOREIGN PATENT DOCUMENTS

KR 100838196 B1 6/2008
KR 1020140059512 A 5/2014

* cited by examiner (a)

(b)

(c)

US 10,199,539 B2

VERTICAL ULTRAVIOLET LIGHT EMITTING DEVICE

CROSS-REFERENCE TO RELATED APPLICATION(S)

The present application is a continuation of U.S. patent application Ser. No. 15/515,991, filed on Mar. 30, 2017, which is a 35 U.S.C. § 371 National Stage Application of PCT Application No. PCT/KR2015/010317, filed Sep. 30, 2015, which further claims the benefits and priority of prior Korean Patent Application No. 10-2014-0131986, filed Sep. 30, 2014. The entire disclosures of the above applications are incorporated by reference in their entirety as part of this document.

TECHNICAL FIELD

The present invention relates to an ultraviolet (UV) light emitting device, and more particularly to a UV light emitting device that emits UV light and includes a hole distribution layer in the middle of a p-type semiconductor layer to improve hole injection efficiency into an active layer.

BACKGROUND

A light emitting device is an inorganic semiconductor device that emits light through recombination of electrons and holes. A UV light emitting device emits UV light and can be used in various fields including curing of polymer materials, sterilization of medical equipment, device components, light sources for generation of white light, and the like. As such, UV light emitting devices have been increasingly used in in various fields.

Like typical light emitting devices, the UV light emitting device includes an active layer interposed between an n-type semiconductor layer and a p-type semiconductor layer. The UV light emitting device emits light having relatively short peak wavelengths (generally, peak wavelengths of 400 nm or less). Thus, in fabrication of the UV light emitting device using a nitride semiconductor, there can be a problem of absorption of UV light emitted from the active layer into n-type and p-type nitride semiconductor layers when then-type and p-type nitride semiconductor layers have smaller band-gaps than energy of UV light. As a result, the UV light emitting device suffers from significant deterioration in luminous efficacy.

Thus, in order to prevent deterioration in luminous efficacy, the UV light emitting device contains a certain amount of Al in the active layer and a nitride semiconductor layer at a UV light emitting side. However, since GaN has a band-gap of about 3.4 eV and absorbs light having a wavelength of about 360 nm or less, Al must be contained in the nitride semiconductor layer in order to emit light having a shorter wavelength than this wavelength. As the band-gap increases due to the presence of Al, ionization energy of holes increases together with decrease in activation rate, such that hole injection efficiency into the active layer is reduced. In order to solve this problem, although there is a conventional technique wherein plural layers having different concentrations of p-type dopants are alternately stacked one above another to provide lateral hole dispersion based on a difference in doping concentration between the layers, this technique provide insignificant hole dispersion and cannot sufficiently suppress deterioration in hole dispersibility of the UV light emitting device.

SUMMARY

Exemplary embodiments provide a UV light emitting device which includes an Al-delta layer having a higher band-gap in a hole injection direction than other directions in order to prevent deterioration in hole dispersibility, thereby improving hole injection efficiency into an active layer and lateral hole dispersibility based on a two-dimensional hole gas effect.

In accordance with one exemplary embodiment, a UV light emitting device includes: a substrate; an n-type semiconductor layer disposed on the substrate; an active layer disposed on the n-type semiconductor layer; a hole injection layer disposed on the active layer and including Al; an Al-delta layer disposed on the hole injection layer and including Al; and a contact layer disposed on the Al-delta layer, wherein the contact layer has a lower Al content than the hole injection layer, a band-gap of the first p-type contact layer is lower than or equal to energy of light emitted from the active layer, and the Al-delta layer has a higher Al content than the hole injection layer and a higher doping concentration than the hole injection layer. The Al-delta layer may have a thickness allowing holes to enter the active layer by tunneling therethrough, preferably 20 nm or less.

The UV light emitting device may further include an electron blocking layer interposed between the active layer and the hole injection layer. Here, the hole injection layer may have a band-gap higher than or equal to energy of light emitted from the active layer.

The Al content of the Al-delta layer may gradually increase from the hole injection layer to the contact layer. In addition, the Al-delta layer may include a first Al-delta layer disposed on the hole injection layer and having a higher Al content than the hole injection layer; and a second Al-delta layer disposed on the first Al-delta layer and having a higher Al content than the first Al-delta layer.

The Al-delta layer may be an undoped layer and may be doped with p-type dopants in order to reduce forward voltage. The p-type dopants may include Mg and the Al-delta layer may have a higher Mg doping concentration than the hole injection layer.

According to exemplary embodiments, in the UV light emitting device, a hole injection layer and an Al-delta layer are provided to a p-type semiconductor layer to increase a difference in band-gap between the Al-delta layer and the p-type semi-conductor layer such that holes can be more uniformly injected into an active layer in the vertical direction through a two-dimensional gas effect at a confinement interface, thereby improving lateral hole dispersion through the Al-delta layer having a high con-centration of AL Further, the UV light emitting device can have low forward voltage and has high hole injection efficiency into the active layer by doping a high con-centration of dopants into the Al-delta layer.

DETAILED DESCRIPTION

Hereinafter, exemplary embodiments will be described in more detail with reference to the accompanying drawings.

Figure 1:
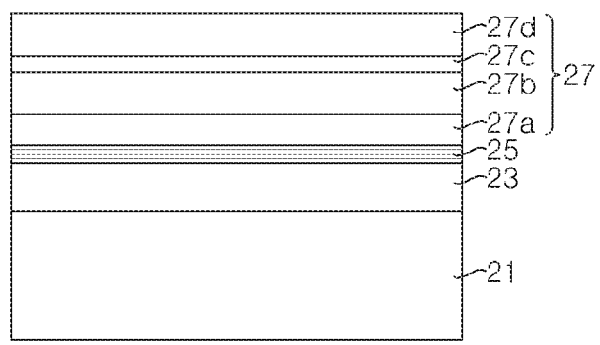
FIG. 1 is a sectional view of a UV light emitting device according to one exemplary embodiment.
Figure 3:
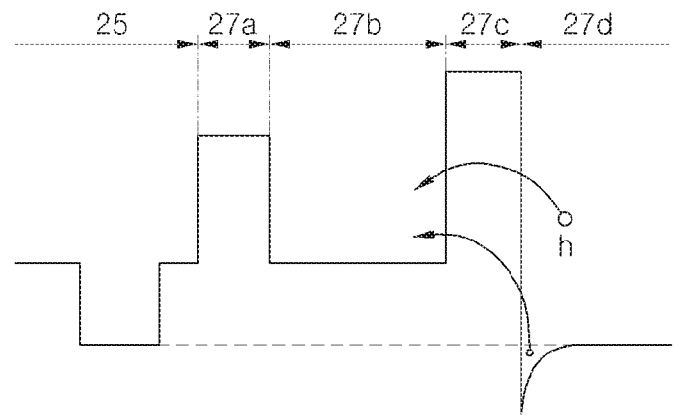
FIG. 3 is a diagram illustrating band-gaps of the UV light emitting device according to the exemplary embodiment.
Figure 3:
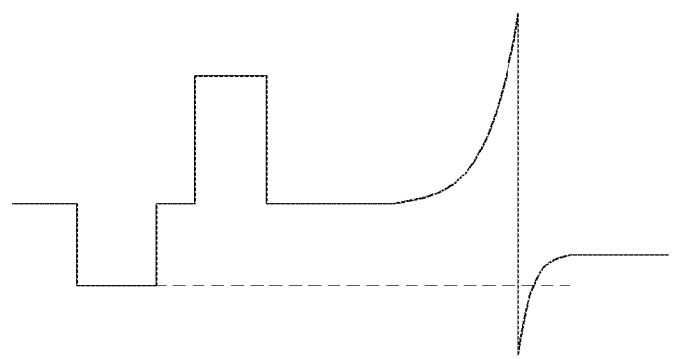
Figure 3:
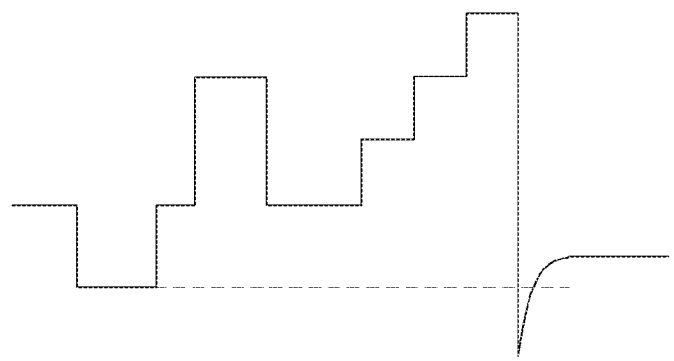

FIG. 1 is a sectional view of a UV light emitting device according to one exemplary embodiment. In description of the UV light emitting device according to this exemplary embodiment, band-gaps of the UV light emitting device will be described with reference to FIG. 3.

Referring to FIG. 1, a UV light emitting device according to one exemplary embodiment includes a substrate 21, a first conductive-type semiconductor layer, an active layer 25, and a second conductive-type semiconductor layer. Herein, the conductive type semiconductor layers are nitride semiconductor layers and may be formed by various methods, for example, metal organic chemical vapor deposition (MOCVD), molecular beam epitaxy (MBE), hydride vapor phase epitaxy (HYPE), and the like.

Referring to FIG. 1, a buffer layer is formed on the substrate 21. The substrate 21 is a substrate for growing nitride semiconductor layers thereon, and may include a sapphire substrate, a silicon carbide substrate, a spinel substrate, a GaN substrate, an AlN substrate, or the like. In this exemplary embodiment, a sapphire substrate or an AlN substrate may be used.

The buffer layer may be formed to a thickness of about 20 nm on the substrate 21. The buffer layer may be a nitride layer including (Al, Ga, In)N and, particularly, may include AlN exhibiting good crystallinity at high temperature and less absorption of visible light. As needed, an AlN layer may be continuously grown to a high thickness of 2 μm on the buffer layer in order to reduce dislocation density.

When the substrate 21 is a nitride substrate such as a GaN substrate or an AlN substrate, the buffer layer can be omitted.

Further, a super-lattice layer may be formed on the buffer layer. The super-lattice layer may include multiple layers consisting of AlGaN layers having different concentrations of Al and alternately stacked one above another, for example, a superlattice layer of $Al_xGa0_xJN/Al_yGa0_yJN$.

The first conductive-type semiconductor layer may be formed on the super-lattice layer. In this exemplary embodiment, the first conductive-type semiconductor layer may be an n-type semiconductor layer 23 and may be grown by MOCVD or the like. The n-type semiconductor layer 23 may include AlGaN and may contain n-type dopants such as Si. For example, the n-type semiconductor layer 23 may be represented by $n-Al_xGa0_xJN$ (0<x<1).

The active layer 25 and the second conductive-type semiconductor layer may be sequentially formed on the n-type semiconductor layer 23. The active layer 25 emits light having certain energy through recombination of electrons and holes. The active layer may have a single quantum well structure or a multi-quantum well structure in which quantum barrier layers and quantum well layers are alternately stacked one above another. Among the quantum barrier layers, a quantum barrier layer nearest the n-type semiconductor layer may have a higher content of Al than other quantum barrier layers. In the structure wherein the quantum barrier layer nearest the n-type semi-conductor layer 23 is formed to have a higher band-gap than the other quantum barrier layers, electron mobility is reduced, thereby effectively preventing overflow of electrons.

The p-type semiconductor layer 27 may be formed on the active layer 25. The p-type semiconductor layer 27 may be formed to a thickness of 50 nm to 300 nm by a process such as MOCVD. The p-type semiconductor layer 27 may include AlGaN, and the Al content of the p-type semiconductor layer 27 is determined to have a higher band-gap than the well layers in the active layer 25 in order to prevent absorption of light emitted from the active layer 25.

The p-type semiconductor layer 27 includes an electron blocking layer 27a, a hole injection layer 27b, an Al-delta layer 27c, and a first p-type contact layer 27d.

The electron blocking layer 27a is formed on the active layer 25 and contains Al. The electron blocking layer 27a may have an Al content of 20 wt % to 40 wt % and an Mg doping concentration of 3E18/cm3 to 5E19/cm3. Further, the hole injection layer 27b may be formed on the electron blocking layer 27a. The hole injection layer 27b may have a lower Al content than the electron blocking layer 27a and has a lower band-gap than the energy of light emitted from the active layer 25, as shown in FIG. 3(a). The doping concentration of the hole injection layer 27b may also be lower than that of the electron blocking layer 27a. In one exemplary embodiment, the hole injection layer 27b may have an Al content of 20 wt % to 30 wt %. In this exemplary embodiment, the hole injection layer 27b may have an Mg doping concentration of 1E18/cm3 to 5E19/cm3.

The first p-type contact layer 27d may be formed on the hole injection layer 27b. The first p-type contact layer 27d may have an Al content lower than or equal to the Al content of the hole injection layer 27b and be grown to a thickness of 50 nm to 100 nm. The first p-type contact layer 27d may have an Mg doping concentration of 5E19/cm3 to 1E20/cm3.

The Al-delta layer 27c may be interposed between the hole injection layer 27b and the first p-type contact layer 27d. The Al-delta layer 27c is doped with Mg to have an Mg doping concentration higher than or equal to that of the first p-type contact layer 27d and has a higher Al content than the hole injection layer 27b. Here, an excessively thick thickness of the Al-delta layer 27c reduces hole injection efficiency into the active layer 25 and an excessively thin thickness of the Al-delta layer 27c provides an insufficient two-dimensional hole gas effect, thereby deteriorating lateral hole dispersibility. In one exemplary embodiment, the Al-delta layer 27c may have a thickness of 2 nm to 20 nm. Further, although the Al-delta layer 27c may be an undoped layer, the Al-delta layer 27c may be additionally doped with p-type dopants in order to improve hole injection efficiency while reducing forward voltage. The Al-delta layer 27c may have an Mg doping concentration of 5E20/cm3 or less.

In the structure wherein the UV light emitting device includes the Al-delta layer 27c, when holes hare injected from the first p-type contact layer 27d to the hole injection layer 27b, the holes are two-dimensionally confined by the Al-delta layer 27c to form two-dimensional hole gas (2DHG), as shown in FIG. 3(a), thereby improving lateral hole dispersibility. As a result, the holes can be efficiently injected into the active layer by tunneling. The Al-delta layer 27c may be doped with p-type dopants and have a higher doping concentration than the hole injection layer 27b, thereby improving lateral hole dispersibility and hole injection efficiency into the active layer 25 while reducing forward voltage.

The Al-delta layer 27c may be composed of a single layer and have a gradually increasing Al content towards the first p-type contact layer 27d, as shown in FIG. 3(b). In order to have the structure wherein the Al content of the Al-delta layer 27c varies in the vertical direction, an Al content of a source gas is intentionally increased such that the Al content of the Al-delta layer 27c gradually increases upwards in the vertical direction upon growth of the Al-delta layer 27c.

The Al-delta layer 27c is grown after growth of the hole injection layer 27b and growth of the Al-delta layer 27c is performed after stopping supply of the Al source gas and performing heat treatment. As a result, the Al source remaining in a chamber is adsorbed to a surface of the Al-delta layer 27c and reacts therewith such that the Al-delta layer 27c can be grown to have a gradually increasing Al content.

As such, as the Al content is gradually increased in the upward direction, the 2DHG effect caused by stress between the Al-delta layer 27c and the first p-type contact layer 27d is maintained while relieving stress caused by a difference in lattice parameter between the Al-delta layer 27c and the hole injection layer 27b, whereby holes having passed through the Al-delta layer 27c by tunneling can be more efficiently injected into the active layer 25.

Figure 2:
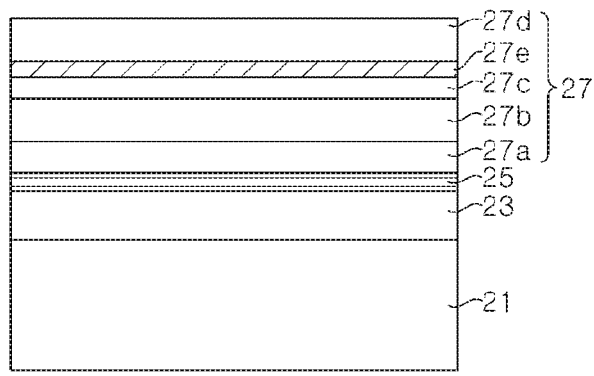
FIG. 2 is a sectional view of a UV light emitting device according to another exemplary embodiment.

FIG. 2 is a sectional view of a UV light emitting device according to another exemplary embodiment. In description of the UV light emitting device according to this exemplary embodiment, band-gaps of the UV light emitting device will be described with reference to FIG. 3.

In a UV light emitting device according to another exemplary embodiment, the Al-delta layer 27c may be composed of multiple layers. The Al-delta layer 27c composed of the multiple layers may be formed by growing an Al-delta layer 27c having a low Al content, followed by sequentially growing Al-delta layers 27c having higher Al contents thereon. In this way, the Al-delta layer 27c composed of the multiple layers is sequentially grown as shown in FIG. 3(c), whereby the 2DHG effect caused by stress between the Al-delta layer 27c and the first p-type contact layer 27d can be further reinforced by counter stress generated between two Al-delta layers 27c while further relieving stress due to the difference in lattice parameter between the Al-delta layer 27c and the hole injection layer 27b.

The first p-type contact layer 27d may contain indium (In) and have a lower Al concentration than the hole injection layer 27b. Accordingly, the band-gap of the first p-type contact layer 27d may be lower than the hole injection layer 27b and may be lower than or equal to the energy of light emitted from the active layer 25. Further, the first p-type contact layer 27d may have a higher Mg doping concentration than the hole injection layer 27b. In one exemplary embodiment, the first p-type contact layer 27d may have an In content of 1 wt % to 20 wt %, a thickness of 0.5 nm to 20 nm, and an Mg doping concentration of 1E19/cm3 or less.

As shown in FIG. 2, the p-type semiconductor layer may further include a second p-type contact layer 27e between the first p-type contact layer 27d and the Al-delta layer 27c. The second p-type contact layer 27e may be formed of AlGaN and may have a lower doping concentration than the first p-type contact layer 27d and the Al content of the second p-type contact layer 27e may be determined such that the band-gap of the second p-type contact layer 27e is lower than the energy of light emitted from the hole injection layer 27b and the active layer 25. In one exemplary embodiment, the second p-type contact layer 27e may include p-type GaN. Since the first p-type contact layer 27d and the second p-type contact layer 27e have lower band-gaps than the energy of light emitted from the active layer 25 and thus can absorb light, the first p-type contact layer 27d and the second p-type contact layer 27e are preferably formed as thin as possible by taking into account contact resistance with a p-type electrode (not shown) and hole injection efficiency. For example, a total thickness of the first p-type contact layer 27d and the second p-type contact layer 27e may range from 1 nm to 50 nm.

The p-type electrode (not shown) is formed on an upper side of the first p-type contact layer 27d to inject current (holes) into the nitride semiconductor, and may be composed of a single layer formed of Ni, Ti, W or Au, or multiple layers thereof. In one exemplary embodiment, the p-type electrode is composed of an Ni layer having a thickness of 0.1 nm to 5 nm and an Au layer having a thickness of 1 nm to 20 nm.

Although some exemplary embodiments are disclosed in conjunction with the drawings, it should be understood that these embodiments and the accompanying drawings are provided for illustration only and are not to be construed as limiting the present invention. The scope of the present invention should be interpreted according to the following appended claims as covering all modifications or variations derived from the appended claims and equivalents thereof.

LIST OF REFERENCE NUMERALS

21: Substrate 23: n-type semiconductor layer
25: Active layer 27: p-type semiconductor layer
27a: Electron blocking layer 27b: Hole injection layer
27c: Al-delta layer 27d: First p-type contact layer
27e: Second p-type contact layer From the foregoing, it will be appreciated that specific embodiments of the invention have been described herein for purposes of illustration, but that various modifications may be made without deviating from the scope of the invention. Accordingly, the invention is not limited except as by the appended claims.

We claim:
1. An UV light emitting device comprising:
a substrate for growing nitride semiconductor layers;
a buffer layer disposed on the substrate and including $Al_xGa_{1-x}N$ ($0 \leq x \leq 1$);
an n-type semiconductor layer disposed on the buffer layer and including $Al_yGa_{1-y}N$ ($0 < y < 1$) doped with an n-type dopant;
an active layer disposed on the n-type semiconductor layer;
an electron blocking layer containing Al at least 20 wt % and disposed on the active layer;
a p-type multilayer including a first layer and a second layer that include Al;
a p-type contact layer disposed on the p-type multilayer and including Al; and
a p-type electrode is formed on the p-type contact layer to supply current into the device, and
wherein the Al content of the p-type contact layer is lower than the Al content of the p-type multilayer,
a band-gap of the p-type contact layer is lower than or equal to an energy bandgap of light emitted from the active layer,
the Al content of the first layer is higher than that of the second layer to facilitate a move of a hole from the p-type multilayer to the active layer, and
wherein a stress between the first layer and the second layer strengthens the stress between the p-type multilayer and the p-type contact layer.
2. The UV light emitting device of claim 1, wherein the buffer layer has higher thickness than 2 μm.
3. The UV light emitting device of claim 1, further comprising a super-lattice layer interposed between the buffer layer and the active layer and consisting of AlGaN layers.
4. The UV light emitting device of claim 3, wherein the AlGaN layers of the super-lattice layer have different concentration of Al from each other and alternately stacked one above another.

5. The UV light emitting device of claim 1, wherein the active layer has a multi-quantum well structure in which quantum barriers and quantum wells are alternately stacked.

6. The UV light emitting device of claim 5, wherein the quantum barrier layers include a quantum barrier layer located closest to the n-type semiconductor layer than other quantum barrier layers and having a higher content of Al than other quantum barrier layers.

7. The UV light emitting device of claim 5, wherein the quantum barrier layers include a quantum barrier layer located closest to the n-type semiconductor layer than other quantum barrier layers and having a higher band-gap than other quantum barrier layers.

8. The UV light emitting device of claim 1, wherein the n-type semiconductor layer has a lower content of Al than the buffer layer.

9. The UV light emitting device of claim 1, further comprising a hole injection layer Al interposed between the electron blocking layer and the p-type multilayer and having a lower Al content than the electron blocking layer and higher Al content than the p-type contact layer.

10. The UV light emitting device of claim 9, wherein the hole injection layer has a lower band-gap than the energy bandgap of light emitted from the active layer.

11. The UV light emitting device of claim 9, wherein the hole injection layer has a doping concentration lower than that of the electron blocking layer.

12. The UV light emitting device of claim 9, wherein the p-type contact layer has a Mg doping concentration higher than the hole injection layer and the hole injection layer has an Mg doping concentration of $1\times10^{18}/cm^3$ to $5\times10^{19}/cm^3$.

13. The UV light emitting device of claim 9, wherein the hole injection layer has a lattice parameter different from that of the p-type multilayer.

14. The UV light emitting device of claim 1, wherein the p-type contact layer includes a first p-type contact layer having a thickness of 50 nm to 100 nm and having an Mg doping concentration of $5\times10^{19}/cm^3$ to $5\times10^{20}/cm^3$.

15. The UV light emitting device of claim 1, wherein the p-type multilayer is doped with p-type dopants including Mg and having an Mg doping concentration of $5\times10^{20}/cm^3$ or less.

16. The UV light emitting device of claim 15, wherein the p-type multilayer has a doping concentration higher than the hole injection layer.

17. The UV light emitting device of claim 1, wherein the p-type multilayer includes the highest concentration of Al as compared to adjacent layers.

18. The UV light emitting device of claim 9, wherein the p-type multilayer has a higher Al content than the hole injection layer.

19. The UV light emitting device of claim 1, wherein the p-type multilayer has a thickness of 2 nm to 20 nm to facilitate an injection of holes into the active layer.

20. The UV light emitting device of claim 1, wherein a stress between the p-type multilayer and the p-type contact layer induce a 2DHG (two-dimensional hole gases).

21. The UV light emitting device of claim 1, wherein the p-type contact layer includes indium (In).

22. The UV light emitting device of claim 1, further comprising an additional p-type contact layer located between the p-type contact layer and the p-type multilayer and having a lower doping concentration than the p-type contact layer.

23. The UV light emitting device of claim 22, wherein the additional p-type contact layer includes p-type GaN including AlGaN.

24. The UV light emitting device of claim 23, the band-gap of the additional p-type contact layer is lower than the energy bandgap of light emitted from the active layer.

25. The UV light emitting device of claim 23, wherein a total thickness of the p-type contact layer and the additional p-type contact layer ranges from 1 nm to 50 nm.

26. The UV light emitting device of claim 1, wherein the p-type electrode includes Ni, Ti, W or Au.

27. The UV light emitting device of claim 1, wherein the p-type electrode includes a Ni layer and an Au layer, the Ni layer having a greater thickness than Au layer.

28. An UV light emitting device comprising:
a substrate for growing nitride semiconductor layers;
a buffer layer disposed on the substrate and including $Al_xGa_{1-x}N$ ($0 \le x \le 1$);
an n-type semiconductor layer disposed on the buffer layer and including $Al_yGa_{1-y}N$ ($0<y<1$) doped with an n-type dopant;
an active layer disposed on the n-type semiconductor layer;
an electron blocking layer containing Al at least 20 wt % and disposed on the active layer;
a p-type multilayer including a first layer and a second layer that include Al;
a p-type contact layer disposed on the p-type multilayer and including Al; and
a p-type electrode is formed on the p-type contact layer to supply current into the device, and
wherein the active layer has a multi-quantum well structure in which quantum barriers and quantum wells are alternately stacked,
wherein the Al content of the p-type contact layer is lower than the Al content of the p-type multilayer,
a band-gap of the p-type contact layer is lower than or equal to an energy bandgap of light emitted from the active layer,
the Al content of the first layer is higher than that of the second layer to facilitate a move of a hole from the p-type multilayer to the active layer.

29. The UV light emitting device of claim 28, wherein the buffer layer has higher thickness than 2 μm.

30. The UV light emitting device of claim 28, further comprising a super-lattice layer interposed between the buffer layer and the active layer and consisting of AlGaN layers.

31. The UV light emitting device of claim 28, wherein the active layer has a multi-quantum well structure in which quantum barriers and quantum wells are alternately stacked.

32. The UV light emitting diode of claim 28, wherein the n-type semiconductor layer has a lower content of Al than the buffer layer.

33. The UV light emitting device of claim 28, further comprising a hole injection layer Al interposed between the electron blocking layer and the p-type multilayer and having a lower Al content than the electron blocking layer and higher Al content than the p-type contact layer.

34. The UV light emitting device of claim 28, wherein the p-type contact layer includes a first p-type contact layer having a thickness of 50 nm to 100 nm and having an Mg doping concentration of $5\times10^{19}/cm^3$ to $5\times10^{20}/cm^3$.

35. The UV light emitting device of claim 28, wherein the p-type multilayer is doped with p-type dopants including Mg and having an Mg doping concentration of $5\times10^{20}/cm^3$ or less.

36. The UV light emitting device of claim 28, wherein the p-type multilayer includes the highest concentration of Al as compared to adjacent layers.

37. The UV light emitting device of claim 28, wherein the p-type multilayer has a thickness of 2 nm to 20 nm to facilitate an injection of holes into the active layer.

38. The UV light emitting device of claim 28, wherein a stress between the p-type multilayer and the p-type contact layer induce a 2DHG (two-dimensional hole gases).

39. The UV light emitting device of claim 28, wherein the p-type contact layer includes indium (In).

40. The UV light emitting device of claim 28, further comprising an additional p-type contact layer located between the p-type contact layer and the p-type multilayer and having a lower doping concentration than the p-type contact layer.

41. The UV light emitting device of claim 28, wherein the p-type electrode includes Ni, Ti, W or Au.

42. The UV light emitting device of claim 28, wherein the p-type electrode includes a Ni layer and an Au layer, the Ni layer having a greater thickness than Au layer.

43. The UV light emitting device of claim 28, wherein a stress between the first layer and the second layer strengthens the stress between the p-type multilayer and the p-type contact layer.

\* \* \* \* \*